US008667365B2

(12) United States Patent
Jo et al.

(10) Patent No.: US 8,667,365 B2
(45) Date of Patent: Mar. 4, 2014

(54) FLASH MEMORY SYSTEM THAT USES AN INTERLEAVING SCHEME FOR INCREASING DATA TRANSFER PERFORMANCE BETWEEN A MEMORY DEVICE AND A CONTROLLER AND A METHOD THEROF

(75) Inventors: Nam Phil Jo, Hwaseong-si (KR); Dong Hyuk Chae, Seoul (KR); Sung Chung Park, Daejeon (KR); Dong Gu Kang, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1167 days.

(21) Appl. No.: 12/256,784

(22) Filed: Oct. 23, 2008

(65) Prior Publication Data
US 2009/0150751 A1 Jun. 11, 2009

(30) Foreign Application Priority Data
Oct. 23, 2007 (KR) .......................... 10-2007-0106828

(51) Int. Cl.
*G06F 11/00* (2006.01)
(52) U.S. Cl.
USPC .......................................................... 714/763
(58) Field of Classification Search
USPC .................... 714/782–785, 796, 763
See application file for complete search history.

(56) References Cited

U.S. PATENT DOCUMENTS

| | | | |
|---|---|---|---|
| 5,732,208 A * | 3/1998 | Tamura et al. ................... | 714/28 |
| 6,728,138 B2 * | 4/2004 | Katayama et al. ....... | 365/185.09 |
| 6,775,185 B2 | 8/2004 | Fujisawa et al. | |
| 7,234,087 B2 * | 6/2007 | Tamura et al. ................ | 714/718 |
| 2002/0021598 A1 * | 2/2002 | Song et al. ..................... | 365/200 |
| 2002/0040462 A1 * | 4/2002 | Sawaguchi et al. ........... | 714/794 |
| 2004/0172581 A1 * | 9/2004 | Tamura et al. ................ | 714/718 |
| 2004/0243906 A1 | 12/2004 | Huang | |
| 2005/0122877 A1 * | 6/2005 | Katayama ................... | 369/59.22 |
| 2005/0223158 A1 | 10/2005 | See et al. | |
| 2006/0010363 A1 | 1/2006 | Marelli et al. | |
| 2006/0059409 A1 * | 3/2006 | Lee .............................. | 714/784 |
| 2006/0120172 A1 * | 6/2006 | Lee et al. ................. | 365/189.05 |
| 2006/0277449 A1 * | 12/2006 | Endo ............................. | 714/704 |
| 2007/0067704 A1 * | 3/2007 | Altintas et al. ................ | 714/795 |
| 2007/0198888 A1 * | 8/2007 | Zhang ............................ | 714/756 |
| 2008/0072120 A1 * | 3/2008 | Radke ........................... | 714/768 |
| 2008/0082730 A1 * | 4/2008 | Kim et al. ..................... | 711/103 |

* cited by examiner

*Primary Examiner* — Bryce Bonzo
*Assistant Examiner* — Elmira Mehrmanesh
(74) *Attorney, Agent, or Firm* — F. Chau & Associates, LLC

(57) ABSTRACT

A memory system includes a plurality of memory devices, a controller configured to control the plurality of memory devices, and at least one channel connected between the plurality of memory devices and the controller. The at least one channel includes input/output data lines and control signal lines, which are connected with the plurality of memory devices, and chip enable signal lines respectively connected to each of the plurality of memory devices, wherein the chip enable signal lines enable the plurality of memory devices independently. The controller sends a read command or a program command to one of the plurality of memory devices, and while the one of the plurality of memory devices is performing an internal read operation in response to the read command, the controller reads data from another one of the plurality of memory devices, or while the one of the plurality of memory devices is performing an internal program operation in response to the program command, the controller programs data to another one of the plurality of memory devices.

20 Claims, 8 Drawing Sheets

FLASH MEMORY SYSTEM THAT USES AN INTERLEAVING SCHEME FOR INCREASING DATA TRANSFER PERFORMANCE BETWEEN A MEMORY DEVICE AND A CONTROLLER AND A METHOD THEROF

CROSS-REFERENCE TO RELATED APPLICATION

This application claims priority under 35 U.S.C. §119 to Korean Patent Application No. 10-2007-0106828, filed on 23 Oct. 2007, in the Korean Intellectual Property Office, the disclosure of which is incorporated by reference herein in its entirety.

BACKGROUND

1. Technical Field

The present invention relates to a memory system that uses a data interleaving scheme for increasing data transfer performance and a method thereof.

2. Discussion of the Related Art

Memory systems generally include a controller and memory devices. The controller manages the flow of data going to and from the memory devices and includes a buffer memory for storing data output from the memory devices. Each of the memory devices includes a memory cell array and a page buffer for storing data output from the memory cell array, which is to be transferred to the buffer memory in the controller.

In such a memory system, a data transfer time from the memory cell array to the page memory is much longer than a data transfer time from the page memory to the buffer memory in the controller. Consequently, the data transfer performance of the memory system is degraded.

Accordingly, there is a need to improve the data transfer performance of a memory system.

SUMMARY OF THE INVENTION

According to an exemplary embodiment of the present invention, there is provided a memory system including a plurality of memory devices, a controller configured to control the plurality of memory devices, and at least one channel connected between the plurality of memory devices and the controller. The at least one channel includes input/output data lines and control signal lines, which are connected with the plurality of memory devices, and chip enable signal lines respectively connected to each of the plurality of memory devices, wherein the chip enable signal lines enable the plurality of memory devices independently. The controller sends a read command or a program command to one of the plurality of memory devices, and while the one of the plurality of memory devices is performing an internal read operation in response to the read command, the controller reads data from another one of the plurality of memory devices, or while the one of the plurality of memory devices is performing an internal program operation in response to the program command, the controller programs data to another one of the plurality of memory devices.

Each of the plurality of memory devices may include a multi-level cell memory array in which a plurality of data bits are stored in a memory cell.

The controller may include at least one error correcting code (ECC) block configured to detect and correct an error in data output through the at least one channel from the plurality of memory devices.

The ECC block may include an ECC encoder block configured to encode data received from a host and output the encoded data to the plurality of memory devices; and an ECC decoder block including a syndrome computation block configured to compute a syndrome based on whether data output from at least one of the plurality of memory devices has an error, a key equation solver block configured to obtain coefficients of an error position equation using the syndrome received from the syndrome computation block, a Chien searching block configured to perform an algorithm for obtaining a solution of the error position equation using the coefficients, and an error evaluator block configured to obtain an error position in the data output from the at least one of the plurality of memory devices based on a result of performing the algorithm.

The key equation solver block, the Chien searching block, and the error evaluator block may operate in a pipeline mode.

Each of the plurality of memory devices may include a memory cell array, and a page buffer configured to store data read from the memory cell array or data to be programmed to the memory cell array.

The internal read operation comprises transferring data stored in the memory cell array to the page buffer and the internal program operation comprises transferring data stored in the page buffer to the memory cell array.

The ECC block may include an ECC encoder block configured to encode data received from a host and output the encoded data to the plurality of memory devices; and an ECC decoder block comprising a branch metric calculation block configured to compute a branch metric based on whether data output from at least one of the plurality of memory devices has an error, an add-compare-select block configured to add a state metric stored in a state metric memory block to the branch metric and output a result of the addition as a new state metric, the state metric memory block is configured to receive the new state metric from the add-compare-select block and update state metrics stored therein, and a survivor path memory block configured to obtain a survivor path for the data output from the at least one of the plurality of memory devices based on the new state metric output from the add-compare-select block.

The add-compare-select block, the state metric memory block and the survivor path memory block operate in a pipeline mode.

According to an exemplary embodiment of the present invention, there is provided an interleaving method for a memory system. The interleaving method includes sending a read command or a program command to one of a plurality of memory devices using a controller, performing an internal read operation using the one of the plurality of memory devices in response to the read command, or performing an internal program operation using the one of the plurality of memory devices in response to the program command, and reading data from another one of the plurality of memory devices using the controller while the one of the plurality of memory devices is performing the internal read operation, or programming data to another one of the plurality of memory devices using the controller while the one of the plurality of memory devices is performing the internal program operation.

The internal read operation may include transferring data stored in a memory cell array to a page buffer of the one of the plurality of memory devices and the internal program operation may include transferring data stored in the page buffer to the memory cell array. Each of the plurality of memory devices may include a multi-level cell memory array in which a plurality of data bits are stored in a memory cell.

The interleaving method may further include detecting an error in the data output from the plurality of memory devices using an ECC block.

Detecting the error in the data may include computing a syndrome, based on whether the data output from at least one of the plurality of memory devices has an error, using a syndrome computation block; obtaining coefficients of an error position equation using the syndrome received from the syndrome computation block, using a key equation solver block; performing an algorithm for obtaining a solution of the error position equation using the coefficients, using a Chien searching block; and obtaining an error position in the data output from the at least one of the plurality of memory devices based on a result of performing the algorithm, using an error evaluator block.

The key equation solver block, the Chien searching block, and the error evaluator block may operate in a pipeline mode.

Detecting the error in the data may include: computing a branch metric based on whether the data output from at least one of the plurality of memory devices has an error, using a branch metric calculation block; adding a state metric stored in a state metric memory block to the branch metric and outputting a result of the addition as a new state metric, using an add-compare-select block; receiving the new state metric from the add-compare-select block and updating state metrics stored in the state metric memory block, using the state metric memory block; and obtaining a survivor path for the data output from the at least one of the plurality of memory devices based on the new state metric output from the add-compare-select block, using a survivor path memory block.

The add-compare-select block, the state metric memory block and the survivor path memory block operate in a pipeline mode.

Sending the read command to the one of the plurality of memory devices using the controller may include: outputting a chip enable signal to the one of the plurality of memory devices; outputting a status check command to the one of the plurality of memory devices; outputting data stored in a page buffer of the one of the plurality of memory devices when it is determined that the one of the plurality of memory devices is in a ready state as a status check result; and after the output of the data is completed, outputting a read command and an address to the one of the plurality of memory devices to output next data.

Sending the program command to the one of the plurality of memory devices using the controller may include: outputting a chip enable signal to the one of the plurality of memory devices; outputting a status check command to the one of the plurality of memory devices; outputting a program command and an address to the one of the plurality of memory devices; and outputting data associated with the address to a page buffer of the one of the plurality of memory devices, when it is determined that the one of the plurality of memory devices is in a ready state as a status check result.

According to an exemplary embodiment of the present invention, a memory system includes a plurality of memory devices; a controller configured to control the plurality of memory devices, wherein the controller independently accesses one of the plurality of memory devices while a data transfer operation is being performed between a memory cell array and a page buffer in another one of the plurality of memory devices; and at least one channel connected between the plurality of memory devices and the controller, the at least one channel comprising input/output data lines and control signal lines, which are connected in common with the plurality of memory devices, and chip enable signal lines respectively connected to each of the plurality of memory devices, wherein the chip enable signal lines enable the memory devices independently.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Exemplary embodiments of the present invention will be described more fully hereinafter with reference to the accompanying drawings. This invention may, however, be embodied in many different forms and should not be construed as limited to the embodiments set forth herein.

It will be understood that when an element is referred to as being "connected" or "coupled" to another element, it can be directly connected or coupled to the other element or intervening elements may be present.

Figure 1:
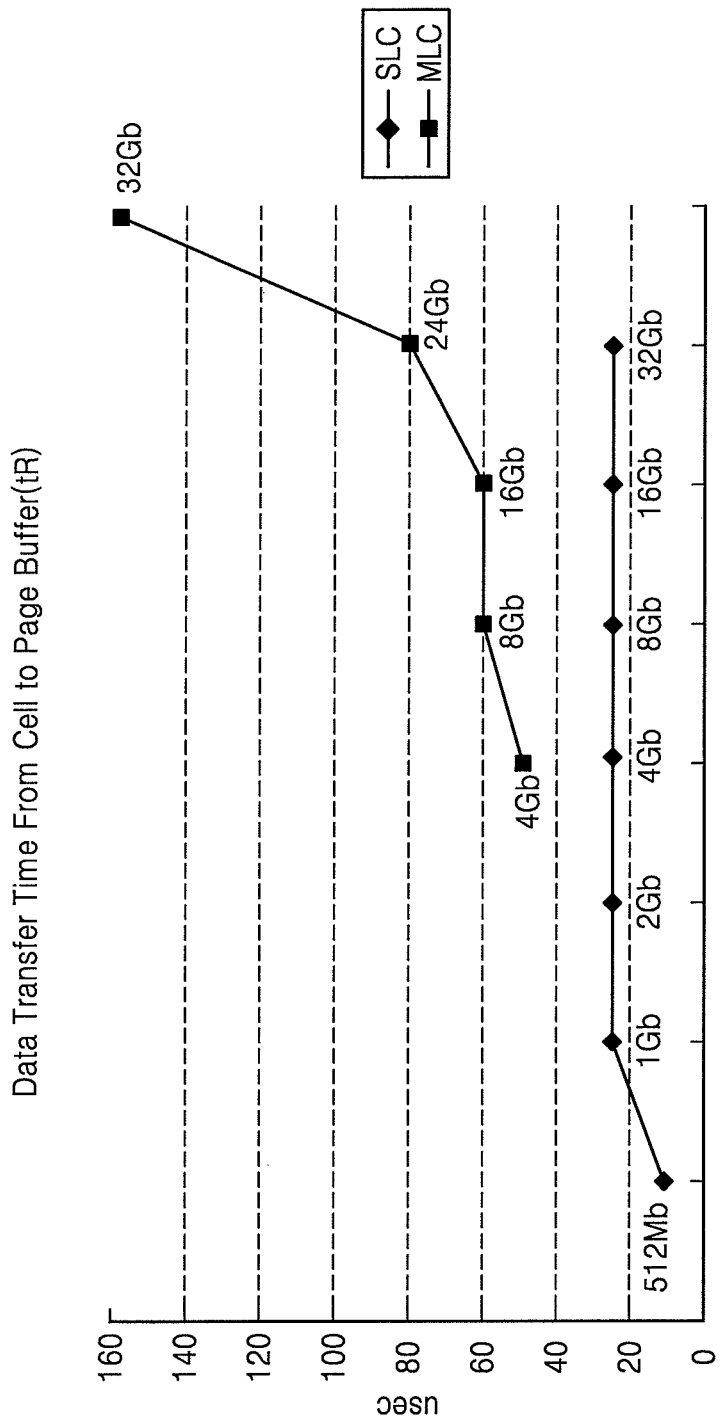
FIG. 1 is a graph of data transfer time from a memory cell to a page buffer versus memory capacity.

FIG. 1 is a graph of data transfer time from a memory cell to a page buffer versus memory capacity. Referring to FIG. 1, as the memory capacity increases, the data transfer time from the memory cell to the page buffer, in other words, a time it takes to read data from the memory cell and transfer it to the page buffer, also increases.

In particular, the data transfer time from the memory cell to the page buffer in a memory device including a multi-level cell (MLC) for storing a plurality of data bits in a memory cell is much longer than that in a memory device including a single-level cell (SLC) for storing a single data bit in a memory cell. This is because the number of times data is read from the MLC is much more than that in the SLC. For instance, a 16-Gbyte MLC memory device needs about three times more data transfer time than a 16-Gbyte SLC memory device.

In addition, as the memory capacity increases, the data transfer time from the memory cell to the page buffer rapidly increases in the MLC memory device. Although not shown, a time it takes to program data from the page buffer to the memory cell is also much longer in the MLC memory device than in the SLC memory device. The time it takes to program data from the page buffer to the memory cell in the MLC memory device also increases as the memory capacity increases.

Consequently, a delay of data transfer between the memory cell and the page buffer can degrade the entire data transfer performance of a memory system.

Figure 2:
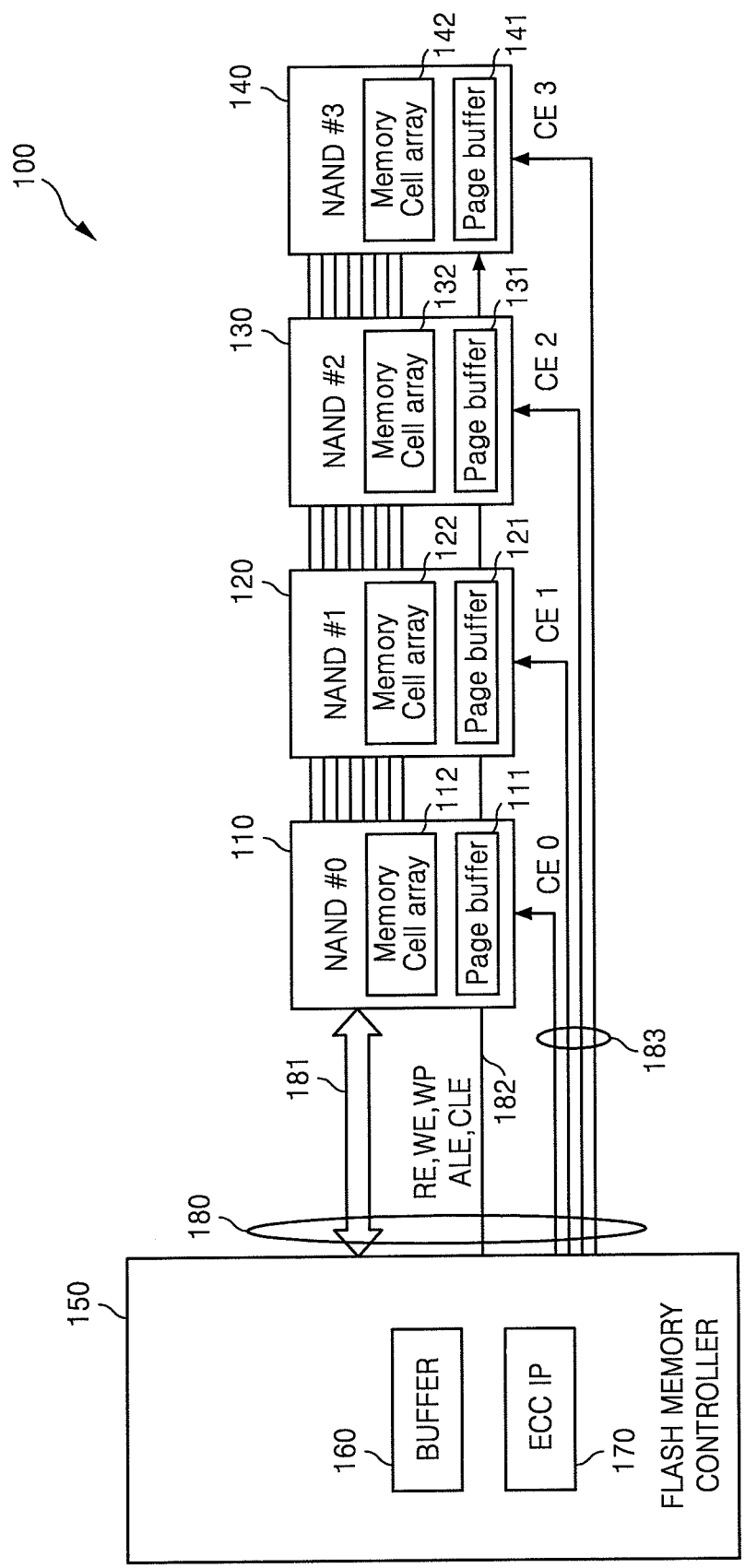
FIG. 2 is a block diagram of a memory system according to an exemplary embodiment of the present invention.

FIG. 2 is a block diagram of a memory system 100 according to an exemplary embodiment of the present invention. Referring to FIG. 2, the memory system 100 includes a plurality of memory devices 110, 120, 130, and 140, a controller 150, and at least one channel 180 for connecting the controller 150 to the memory devices 110, 120, 130, and 140.

The memory devices 110, 120, 130, and 140 include page buffers 111, 121, 131, and 141 and memory cell arrays 112, 122, 132, and 142, respectively. The memory devices 110, 120, 130, and 140 perform an internal read operation in which they output data stored in the memory cell arrays 112, 122, 132, and 142 to the page buffers 111, 121, 131, and 141, respectively. In addition, the memory devices 110, 120, 130, and 140 perform an internal program operation in which they program data stored in the page buffers 111, 121, 131, and 141 to the memory cell arrays 112, 122, 132, and 142, respectively. The memory cell arrays 112, 122, 132, and 142 may be implemented by MLC NAND flash memory.

The channel 180 includes a plurality of input/output data lines 181, a plurality of control signal lines 182, and a plurality of chip enable signal lines 183. The input/output data lines 181 are connected with the memory devices 110, 120, 130, and 140 in common, output data from at least one of the memory devices 110, 120, 130, and 140 to the controller 150, and input host data from the controller 150 to the memory devices 110, 120, 130, and 140.

The control signal lines 182 are connected with the memory devices 110, 120, 130, and 140 in common, and output control signals read enable (RE), write enable (WE), write protect (WP), address latch enable (ALE), and command latch enable (CLE) for accessing a memory cell in one of the memory devices 110, 120, 130, and 140.

There are as many chip enable signal lines 183 as there are memory devices 110, 120, 130, and 140. The chip enable signal lines 183 are respectively connected with the memory devices 110, 120, 130, and 140 and enable the memory devices 110, 120, 130, and 140 independently.

The controller 150 sends a read command to one of the memory devices 110, 120, 130, and 140 and controls another one of the memory devices 110, 120, 130, and 140 to output data while the one of the memory devices 110, 120, 130, and 140 is internally executing a read operation in response to the read command. During a program operation, the controller 150 sends a program command to one of the memory devices 110, 120, 130, and 140 and while the one of the memory devices 110, 120, 130, and 140 is executing the program operation in response to the program command, the controller 150 sends the program command to another one of the memory devices 110, 120, 130, and 140.

For instance, during the read operation, while the first memory device 110 is outputting data stored in the memory cell array 112 to the first page buffer 111 in response to the read command, the controller 150 reads data stored in the second page buffer 121 of the second memory device 120.

The controller 150 includes a buffer memory block 160. The buffer memory block 160 stores data transferred between the controller 150 and the memory devices 110, 120, 130, and 140 through the at least one channel 180. The controller 150 also includes an error correcting code (ECC) block 170 which encodes data received from a host and then outputs the encoded data to the memory devices 110, 120, 130, and 140 or checks data output from the memory devices 110, 120, 130, and 140 for errors, then corrects the errors, and then outputs the data to the host.

Figure 3:
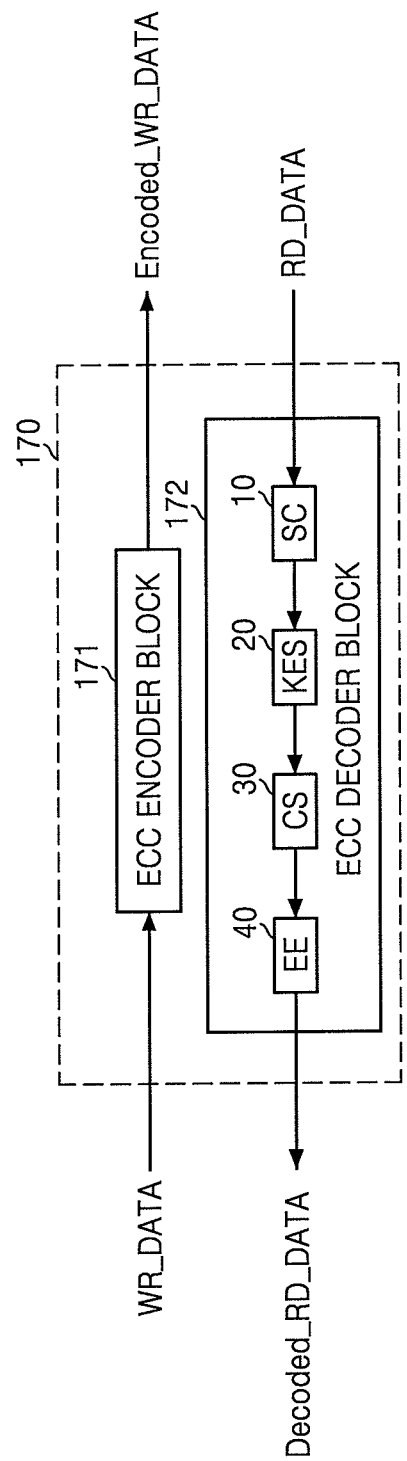
FIG. 3 is a block diagram of an error correcting code (ECC) block illustrated in FIG. 2, according to an exemplary embodiment of the present invention.

FIG. 3 is a block diagram of the ECC block 170 illustrated in FIG. 2, according to an exemplary embodiment of the present invention. The ECC block 170 shown in FIG. 3 is implemented using block code decoding. Referring to FIGS. 2 and 3, the ECC block 170 includes an ECC encoder block 171 and an ECC decoder block 172.

The ECC encoder block 171 encodes data WR_DATA received from the host and outputs encoded data Encoded_WR_DATA to the memory devices 110, 120, 130, and 140. For instance, the ECC encoder block 171 can generate cyclic redundancy check (CRC) data (or syndrome data) using received data.

The ECC decoder block 172 detects an error in data RD_DATA output from the memory devices 110, 120, 130, and 140, corrects the error, and outputs error corrected data Decoded_RD_DATA to the host. In detail, the ECC decoder block 172 includes a syndrome computation (SC) block 10, a key equation solver (KES) block 20, a Chien searching (CS) block 30, and an error evaluator (EE) block 40.

The SC block 10 receives the data RD_DATA read from each of the memory devices 110, 120, 130, and 140 and computes and outputs a syndrome based on whether the data RD_DATA has an error. When it is determined that the data RD_DATA read from each of the memory devices 110, 120, 130, and 140 has an error based on the syndrome computed by the SC block 10, the buffer memory block 160 stops transmitting the data RD_DATA to the host and the controller 150 enters an error correction mode.

When the controller 150 enters the error correction mode, the KES block 20 calculates coefficients of an error position equation with respect to the data RD_DATA and the CS block 30 obtains a solution of the error position equation using a predetermined algorithm (e.g., a Chien search algorithm). The EE block 40 evaluates an error position in the data RD_DATA using the solution obtained by the CS block 30. When the KES block 20, the CS block 30, and the EE block 40 operate in a pipeline mode, data throughput to the host can be increased.

Figure 4:
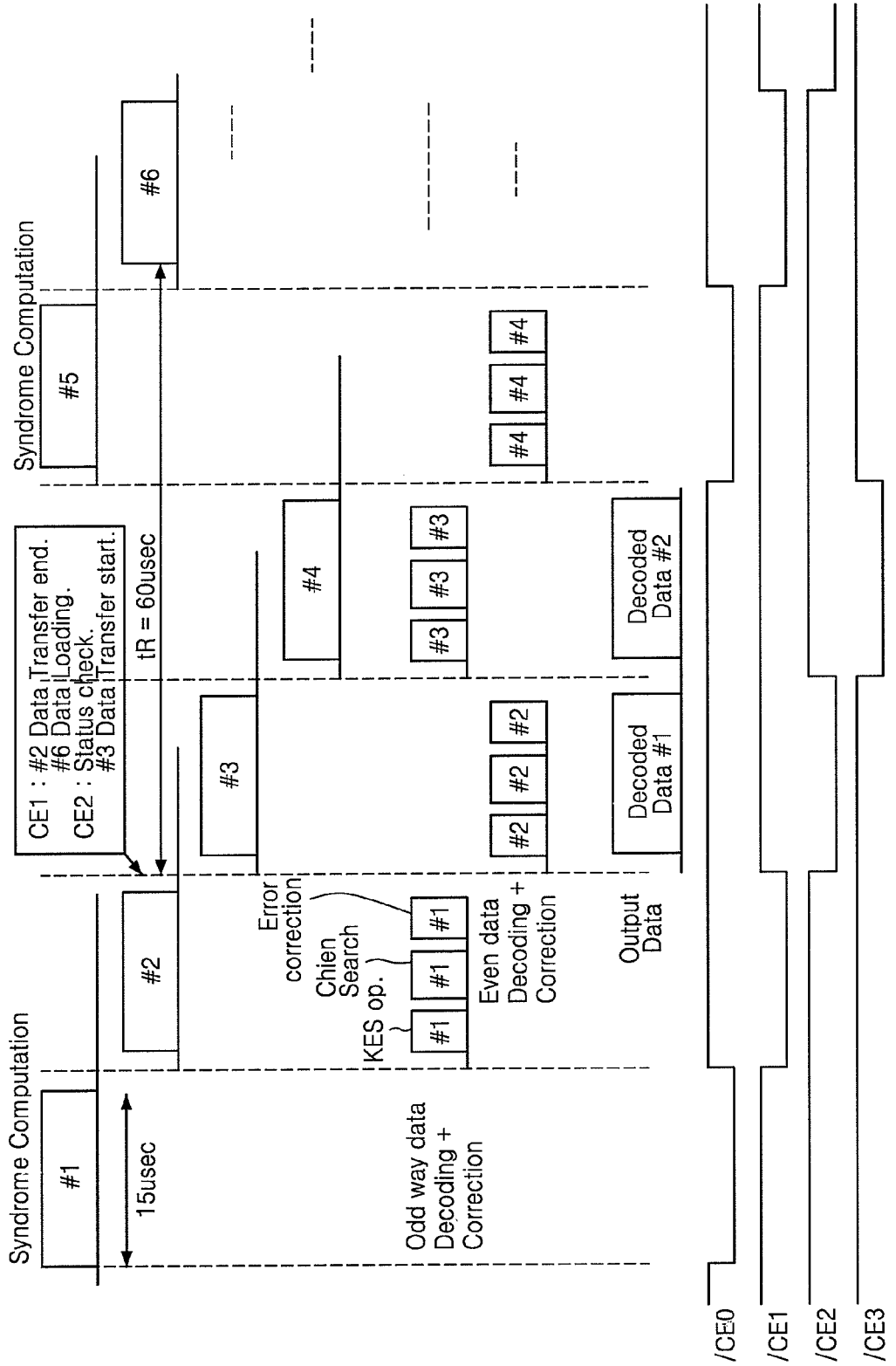
FIG. 4 is a timing chart illustrating the operation of a memory system including the ECC block illustrated in FIG. 3, according to an exemplary embodiment of the present invention.

FIG. 4 is a timing chart illustrating the operation of a memory system including the ECC block 170 illustrated in FIG. 3, according to an exemplary embodiment of the present invention. Referring to FIGS. 2 through 4, the first memory device 110 outputs first data #1 stored in the first page buffer 111 to the buffer memory block 160 included in the controller 150 based on a first chip enable signal /CE0. When the first data #1 is completely transferred to the buffer memory block 160, the controller 150 outputs a read command and an address for fifth data #5 and the first memory device 110 starts to output the fifth data #5 from the first memory cell array 112 to the first page buffer 111. When the first memory device 110 starts internal reading by sending the fifth data #5 to the first page buffer 111, the controller 150 outputs a second chip enable signal /CE1 to the second memory device 120. The second memory device 120 outputs second data #2 stored in the second page buffer 121 to the buffer memory block 160 of the controller 150 in response to the second chip enable signal /CE1 and the controller 150 outputs a read command to the second memory device 120 to output sixth data #6 to the second page buffer 121.

In other words, while one of the memory devices 110, 120, 130, and 140 is performing internal reading, the controller 150 reads data from another one of the memory devices 110, 120, 130, and 140. Similarly, in the program operation of the memory system, while one of the memory devices 110, 120, 130, and 140 is performing internal programming, the controller 150 outputs data to another one of the memory devices 110, 120, 130, and 140.

In the same manner, the third and fourth memory devices 130 and 140 sequentially output third data #3 and fourth data #4 based on third and fourth chip enable signal /CE2 and/ CE3, respectively, and the controller 150 outputs read commands for seventh and eighth data (not shown), respectively.

As illustrated in FIG. 4, with respect to each of the data #1, #2, #3, and #4 output from the memory devices 110, 120, 130, and 140, the SC block 10 included in the ECC decoder block 172 illustrated in FIG. 3 computes a syndrome for detecting an error. When an error is detected based on the syndrome, the error correction mode operates and the ECC decoder block 172 operates in the pipeline mode so that error information of the data #1, #2, #3, and #4 is sequentially calculated and the controller 150 corrects errors in the data #1, #2, #3, and #4 based on the error information.

In calculating the error information, when it is determined that there is an error in the first data #1 read from the first memory device 110 based on the result of computing a syndrome, the SC block 10 outputs syndrome data to the KES block 20. The KES block 20 performs a "key equation" for calculating coefficients of the predetermined error position equation using the syndrome data computed with respect to the first data #1 stored in the buffer memory block 160. At this time, the SC block 10 computes and outputs a syndrome with respect to the second data #2 input thereto following the first data #1.

After the operation of the KES block 20 is completed, the CS block 30 performs a "Chien search" algorithm for obtaining a solution of the error position equation with respect to the first data #1 using the result of performing the key equation. While the CS block 30 is performing the Chien search algorithm with respect to the first data #1, the KES block 20 receives the syndrome computed with respect to the second data #2 and performs the key equation for calculating coefficients of the error position equation with respect to the second data #2 based on the syndrome received with respect to the second data #2.

When the operation of the CS block 30 is completed, the EE block 40 performs an "error evaluation" algorithm for evaluating an error position with respect to the first data #1 using the result of the Chien search algorithm performed with respect to the first data #1 and outputs the result of the error evaluation algorithm. The controller 150 corrects the error in the first data #1 stored in the buffer memory block 160 based on error information (i.e., error position information) output from the EE block 40 with respect to the first data #1 and the buffer memory block 160 outputs corrected data Decoded Data #1 to the host.

When the CS block 30 completes the Chien search algorithm with respect to the first data #1, it receives the result of the key equation with respect to the second data #2 and performs the Chien search algorithm with respect to the second data #2 stored in the buffer memory block 160. While the CS block 30 is performing the Chien search algorithm with respect to the second data #2, the KES block 20 receives a syndrome with respect to the third data #3 and performs the key equation to calculate coefficients of the error position equation with respect to the third data #3.

When the CS block 30 completes the operation, the EE block 40 performs the error evaluation algorithm based on the result of the Chien search algorithm with respect to the second data #2, thereby calculating and outputting error information regarding the second data #2. The controller 150 corrects an error in the second data #2 stored in the buffer memory block 160 based on the error information and the buffer memory block 160 outputs corrected data Decoded Data #2 to the host.

In the memory system 100 according to an exemplary embodiment of the present invention, a time it takes each of the memory devices 110, 120, 130, and 140 to receive a read command and output data stored in its memory cell array 112, 122, 132, or 142 to its page buffer 111, 121, 131, or 141 is about four times longer than a time it takes data to be output from each of the page buffers 111, 121, 131, and 141 to the buffer memory block 160 of the controller 150. However, the memory system 100 may be implemented to perform effective interleaving by changing the number of memory devices connected in common to a single channel according to a ratio between a time it takes to transfer data from a memory cell array to a page buffer in each memory device and a time it takes to transfer data from the page buffer to the buffer memory block 160 of the controller 150.

Figure 5:
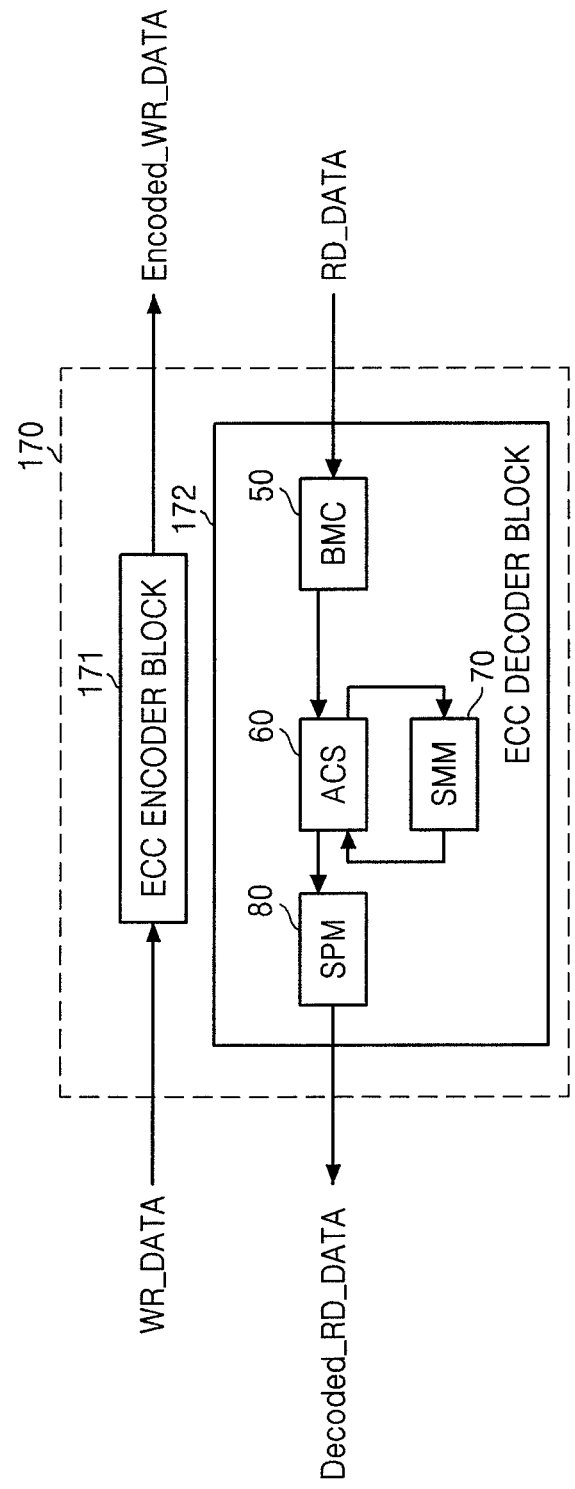
FIG. 5 is a block diagram of the ECC block illustrated in FIG. 2, according to an exemplary embodiment of the present invention.

FIG. 5 is a block diagram of the ECC block 170 illustrated in FIG. 2, according to an exemplary embodiment of the present invention. The ECC block 170 shown in FIG. 5 uses Viterbi code decoding. Referring to FIGS. 2 and 5, the ECC block 170 includes the ECC encoder block 171 and the ECC decoder block 172.

The ECC encoder block 171 encodes data WR_DATA received from the host and outputs encoded data Encoded_WR_DATA to the memory devices 110, 120, 130, and 140. The ECC decoder block 172 detects an error in data RD_DATA output from the memory devices 110, 120, 130, and 140, corrects the error, and outputs error corrected data Decoded_RD_DATA to the host.

In detail, the ECC decoder block 172 includes a branch metric calculation (BMC) block 50, an add-compare-select (ACS) block 60, a state metric memory (SMM) block 70, and a survivor path memory (SPM) block 80. The BMC block 50 receives the data RD_DATA read from each of the memory devices 110, 120, 130, and 140 and computes and outputs a branch metric based on whether the data RD_DATA has an error.

The ACS block 60 receives the calculated branch metric from the BMC block 50, adds a state metric stored in advance in the SMM block 70 to the branch metric, and outputs the result of the addition, which is close to an original data path, as a new state metric. The SMM block 70 receives the new state metric from the ACS block 60 and updates state metrics stored therein. The SPM block 80 stores and outputs only survivor paths among state metrics output from the ACS block 60, thereby correcting an error in the data RD_DATA and outputting decoded read data Decoded_RD_DATA.

Figure 6:
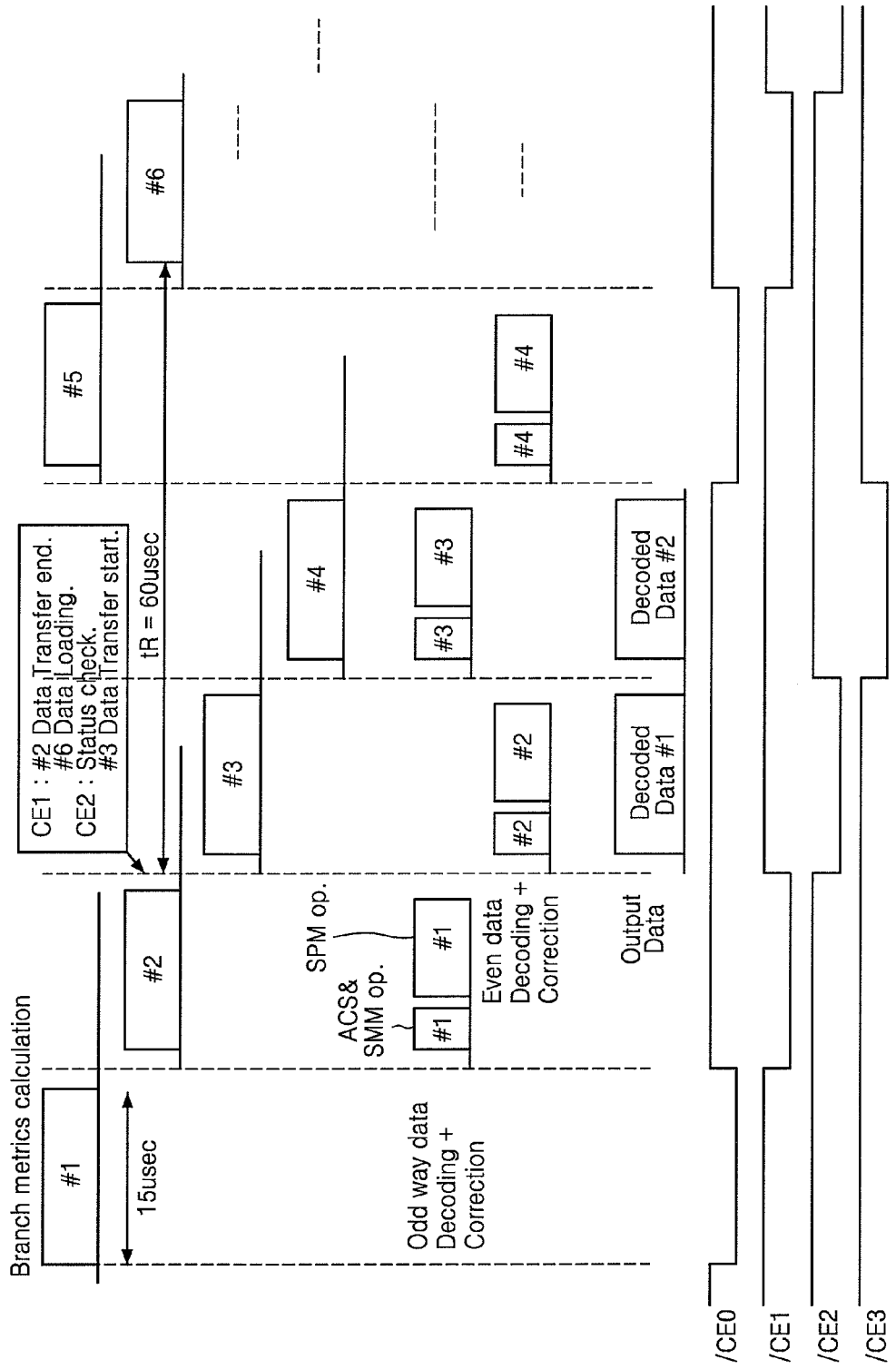
FIG. 6 is a timing chart illustrating the operation of a memory system including the ECC block illustrated in FIG. 5, according to an exemplary embodiment of the present invention.

FIG. 6 is a timing chart illustrating the operation of a memory system including the ECC block 170 illustrated in FIG. 5, according to an exemplary embodiment of the present invention. The read operation of the memory system including the ECC block 170 illustrated in FIG. 5 is almost the same as that described with reference to FIG. 4, except for the process of correcting an error. Thus, only the process of correcting an error will be described in detail below.

Referring to FIGS. 5 and 6, the BMC block 50 computes and outputs branch metrics used to detect errors in the data #1, #2, #3, and #4 respectively output from the memory devices 110, 120, 130, and 140. When an error is detected in any of the data #1, #2, #3, and #4, the controller 150 enters an error correction mode and the ECC decoder block 172 calculates error information with respect to the data #1, #2, #3, and #4 sequentially in a pipeline mode. The controller 150 corrects the error in the data #1, #2, #3, and #4 based on the error information and then outputs error corrected data.

The pipeline mode of the ECC decoder block 172 will be described in detail. When the controller 150 enters the error correction mode, the ACS block 60 adds a result of computing a branch metric with respect to the first data #1 and a state metric stored in advance in the SMM block 70 and outputs a value that is close to an original data path as a new state metric. The SMM block 70 receives the new state metric and updates the state metrics stored therein.

When the operations of the ACS block 60 and the SMM block 70 are completed, the SPM block 80 starts to obtain a survivor path for the first data #1. At this time, the ACS block 60 receives a branch metric for the second data #2, adds the branch metric computed with respect to the first data #2 and the state metric stored in advance in the SMM block 70 and outputs a value that is close to an original data path as a new state metric. The SMM block 70 receives the new state metric and updates the state metric stored therein.

The SPM block 80 obtains and outputs a survivor path for the first data #1 and sequentially obtains and outputs a survivor path for the second data #2. In the same manner, the third and fourth data #3 and #4 are processed in the pipeline mode.

Consequently, the ECC decoder block 172 can quickly and effectively calculate error information with respect to data read from the memory devices 110, 120, 130, and 140. In addition, the area of the ECC decoder block 172 in the ECC block 170 can be reduced.

Examples in which the ECC decoder block 172 uses block code decoding or Viterbi code decoding have been explained with reference to FIGS. 3 through 6; however, the ECC decoder block 172 may also use concatenated code decoding.

Figure 7:
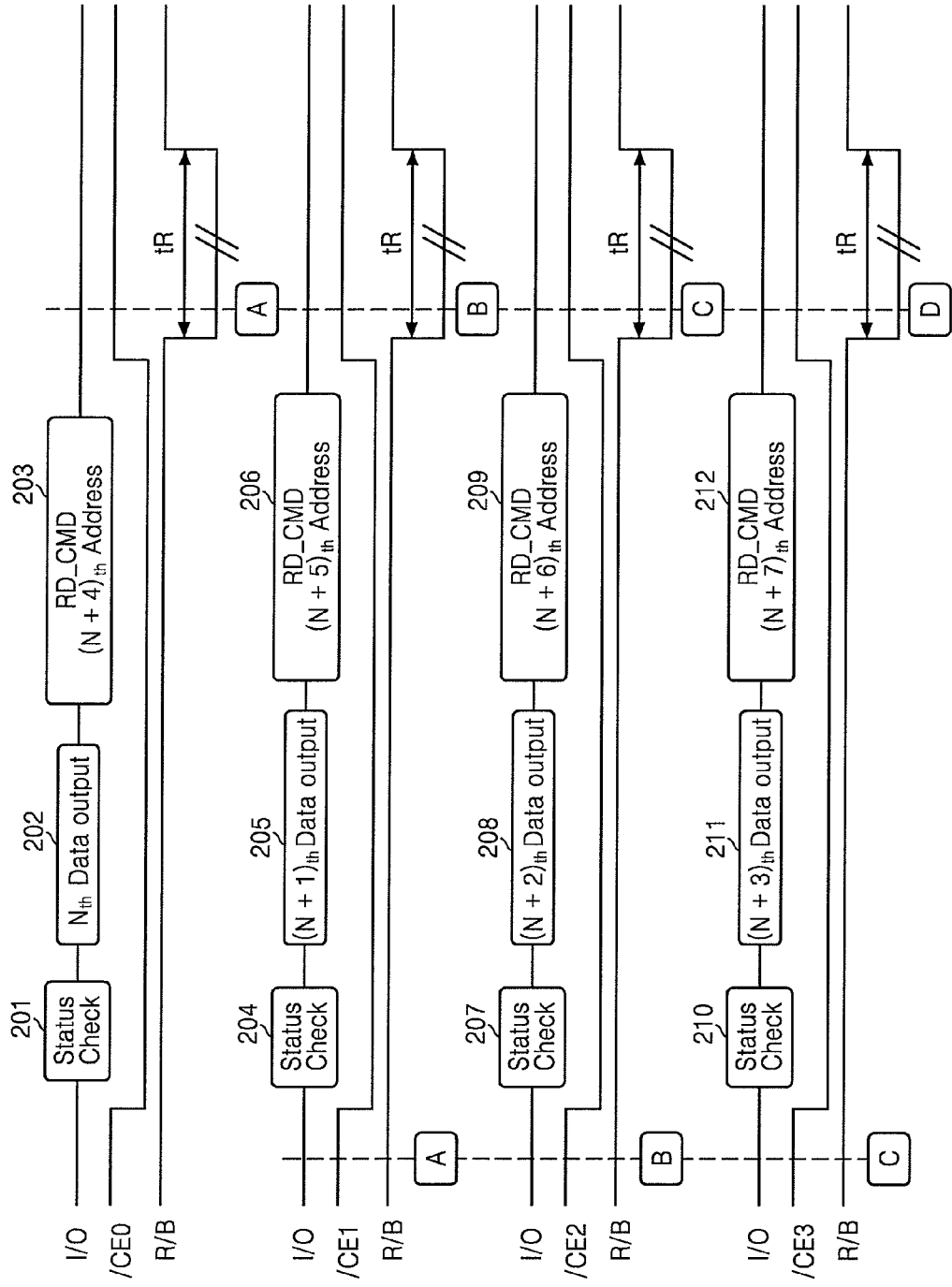
FIG. 7 is a timing chart that illustrates read interleaving according to an exemplary embodiment of the present invention.
Figure 8:
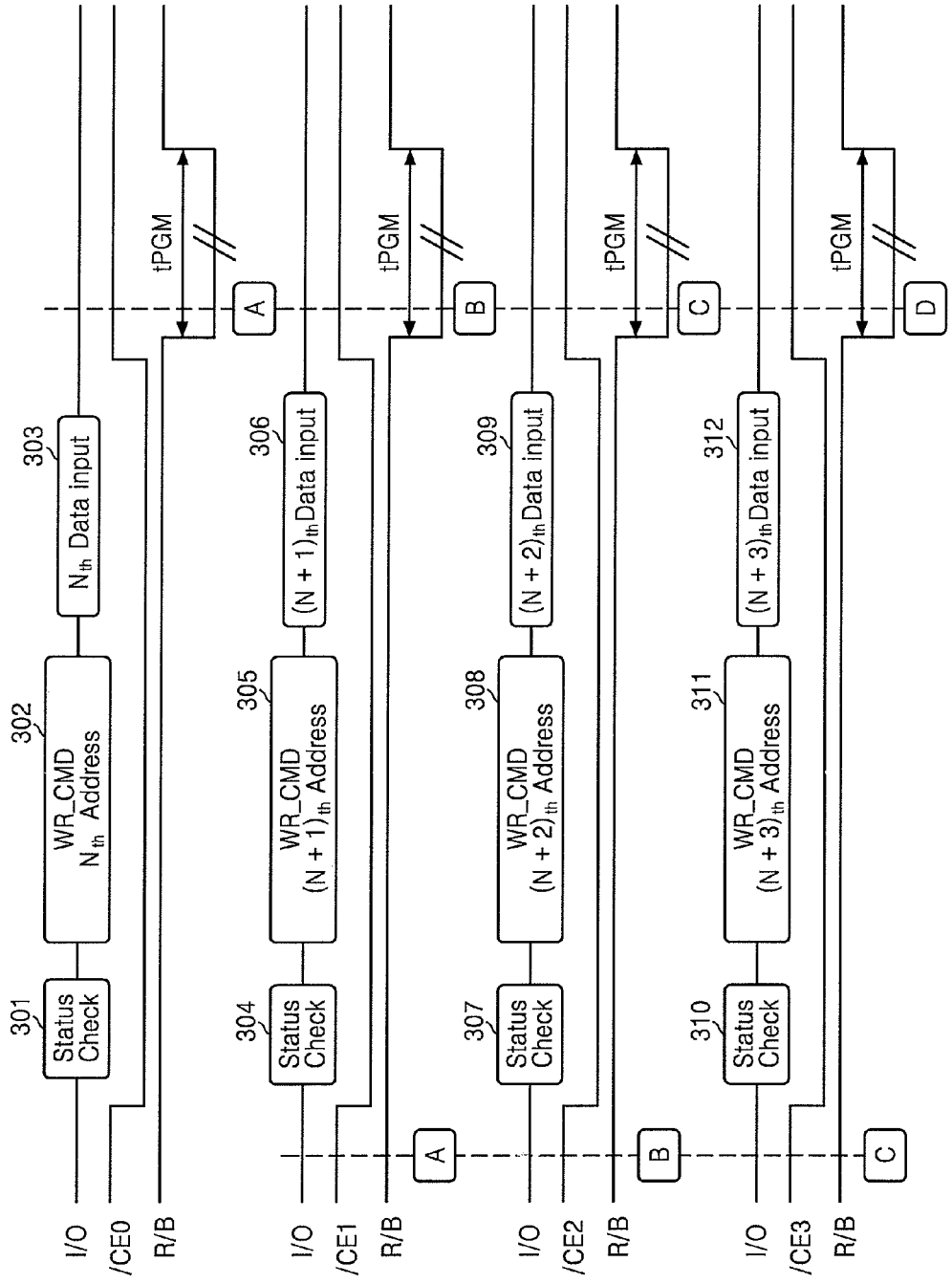
FIG. 8 is a timing chart that illustrates write interleaving according to an exemplary embodiment of the present invention.

FIG. 7 is a timing chart that illustrates read interleaving according to an exemplary embodiment of the present invention. FIG. 8 is a timing chart that illustrates write interleaving according to an exemplary embodiment of the present invention.

Referring to FIGS. 2 and 7, the controller 150 outputs the first chip enable signal /CE0 for transferring N-th (where N is a natural number) data stored in the first page buffer 111 of the first memory device 110 to the buffer memory block 160 of the controller 150. When the first memory device 110 is enabled in response to the first chip enable signal /CE0, the controller 150 outputs a status check command to the first memory device 110 in operation 201. When the first memory device 110 is in a ready state, the data stored in the first page buffer 111 is output to the buffer memory block 160 of the controller 150 in operation 202.

When the output of the N-th data to the buffer memory block 160 is completed, the controller 150 outputs a read command RD_CMD and an address (N+4)-th Address for reading (N+4)-th data in operation 203. When the output of the read command RD_CMD and the address (N+4)-th Address is completed, the first chip enable signal /CE0 is disabled and the first memory device 110 starts to internally transfer the (N+4)-th data from the memory cell array 112 to the first page buffer 111 in a busy state.

When the first memory device 110 starts to transfer the (N+4)-th data from the memory cell array 112 to the first page buffer 111 in the busy state, the controller 150 outputs the second chip enable signal /CE1 and outputs the status check command to the second memory device 120 in operation 204. When the second memory device 120 is in the ready state, the second memory device 120 outputs (N+1)-th data stored in the second page buffer 121 to the buffer memory block 160 of the controller 150 in operation 205.

When the output of the (N+1)-th data to the buffer memory block 160 is completed, the controller 150 outputs the read command RD_CMD and an address (N+5)-th Address for reading (N+5)-th data in operation 206. When the output of the read command RD_CMD and the address (N+5)-th Address is completed, the second chip enable signal /CE1 is disabled and the second memory device 120 starts to internally transfer the (N+5)-th data from the memory cell array 122 to the second page buffer 121 in the busy state.

The operations of the third and fourth memory devices 130 and 140 are substantially the same as those of the first and second memory devices 110 and 120. Thus, detailed descriptions thereof will be omitted.

Referring to FIGS. 2 and 8, in a program operation of the memory system 100, the controller 150 outputs the first chip enable signal /CE0 for programming N-th data to the first memory cell array 112 of the first memory device 110. When the first memory device 110 is enabled in response to the first chip enable signal /CE0, the controller 150 outputs a status check command to the first memory device 110 in operation 301. When the first memory device 110 is in a ready state, the controller 150 outputs a write command WR_CMD and an address N-th Address in operation 302. The controller 150 outputs the N-th data to the first page buffer 111 in operation 303. The first memory device 110 starts to program the N-th data stored in the first page buffer 111 to memory cells corresponding to the address N-th Address in the first memory cell array 112 in response to the write command WR_CMD and enters a busy state. When the first memory device 110 starts programming the N-th data, the first chip enable signal /CE0 is disabled and the controller 150 outputs the second chip enable signal /CE1 to the second memory device 120.

The controller 150 outputs the status check command to the second memory device 120 in operation 304. When the second memory device 120 is in the ready state, the controller 150 outputs the write command WR_CMD and an address (N+1)-th Address for (N+1)-th data in operation 305. The controller 150 outputs the (N+1)-th data to the second page buffer 121 in operation 306. The second memory device 120 starts to program the (N+1)-th data stored in the second page buffer 121 to memory cells corresponding to the address (N+1)-th Address in the second memory cell array 122 in response to the write command WR_CMD and enters the busy state.

The program interleaving of the third and fourth memory devices 130 and 140 is substantially the same as that of the first and second memory devices 110 and 120. Thus, detailed description thereof will be omitted.

According to exemplary embodiments of the present invention, a memory system can independently access memory devices by using a chip enable signal in an interleaving scheme so that a standby time is reduced and a data read/program operation is continuously performed. For example, the memory system can access a memory device while data is being transmitted between a memory cell array and a page buffer in another memory device, thereby speeding up data transfer performance. As a result, the data transfer performance of the memory system can be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory system, comprising:
a plurality of memory devices;
a controller configured to control the plurality of memory devices, wherein the controller sends a read command and a program command to one of the plurality of memory devices at different times, and while the one of the plurality of memory devices is performing an internal read operation in response to the read command, the controller reads data from another one of the plurality of memory devices, and while the one of the plurality of memory devices is performing an internal program operation in response to the program command, the controller programs data to another one of the plurality of memory devices; and
at least one channel connected between the plurality of memory devices and the controller, the at least one channel comprising input/output data lines and control signal lines, which are connected with the plurality of memory devices and provide the read and program commands and read and program addresses to the plurality of memory devices, and chip enable signal lines respectively connected to each of the plurality of memory devices, wherein chip enable signals are provided via the chip enable signal lines to the plurality of memory devices to enable the plurality of memory devices independently,
wherein the one memory device performs the internal read operation when its respective chip enable signal is disabled and the another memory device has its data read when its respective chip enable signal is enabled.

2. The memory system of claim 1, wherein each of the plurality of memory devices comprises a multi-level cell memory array in which a plurality of data bits are stored in a memory cell.

3. The memory system of claim 1, wherein the controller comprises at least one error correcting code (ECC) block configured to detect and correct an error in data output through the at least one channel from the plurality of memory devices.

4. The memory system of claim 3, wherein the ECC block comprises:
an ECC encoder block configured to encode data received from a host and output the encoded data to the plurality of memory devices; and
an ECC decoder block comprising a syndrome computation block configured to compute a syndrome based on whether data output from at least one of the plurality of memory devices has an error, a key equation solver block configured to obtain coefficients of an error position equation using the syndrome received from the syndrome computation block, a Chien searching block configured to perform an algorithm for obtaining a solution of the error position equation using the coefficients, and an error evaluator block configured to obtain an error position in the data output from the at least one of the plurality of memory devices based on a result of performing the algorithm.

5. The memory system of claim 4, wherein the key equation solver block, the Chien searching block, and the error evaluator block operate in a pipeline mode.

6. The memory system of claim 3, wherein the ECC block comprises:
an ECC encoder block configured to encode data received from a host and output the encoded data to the plurality of memory devices; and
an ECC decoder block comprising a branch metric calculation block configured to compute a branch metric based on whether data output from at least one of the plurality of memory devices has an error, an add-compare-select block configured to add a state metric stored in a state metric memory block to the branch metric and output a result of the addition as a new state metric, the state metric memory block configured to receive the new state metric from the add-compare-select block and update state metrics stored therein, and a survivor path memory block configured to obtain a survivor path for the data output from the at least one of the plurality of memory devices based on the new state metric output from the add-compare-select block.

7. The memory system of claim 6, wherein the add-compare-select block, the state metric memory block and the survivor path memory block operate in a pipeline mode.

8. The memory system of claim 1, wherein each of the plurality of memory devices comprises:
a memory cell array; and
a page buffer configured to store data read from the memory cell array and data to be programmed to the memory cell array.

9. The memory system of claim 8, wherein the internal read operation comprises transferring data stored in the memory cell array to the page buffer and the internal program operation comprises transferring data stored in the page buffer to the memory cell array.

10. An interleaving method for a memory system, comprising:
sending a read command at a first time and a program command at a second time to one of a plurality of memory devices using a controller;
performing an internal read operation using the one of the plurality of memory devices in response to the read command, and performing an internal program operation using the one of the plurality of memory devices in response to the program command; and
reading data from another one of the plurality of memory devices using the controller while the one of the plurality of memory devices is performing the internal read operation, and programming data to another one of the plurality of memory devices using the controller while the one of the plurality of memory devices is performing the internal program operation,
wherein the plurality of memory devices are independently accessed in response to chip enable signals provided via chip enable signal lines respectively connected thereto,
wherein the one memory device performs the internal read operation when its respective chip enable signal is disabled and the another memory device has its data read when its respective chip enable signal is enabled.

11. The interleaving method of claim 10, wherein the internal read operation comprises transferring data stored in a memory cell array to a page buffer of the one of the plurality of memory devices and the internal program operation comprises transferring data stored in the page buffer to the memory cell array.

12. The interleaving method of claim 11, wherein each of the plurality of memory devices comprises a multi-level cell memory array in which a plurality of data bits are stored in a memory cell.

13. The interleaving method of claim 10, further comprising detecting an error in the data output from the plurality of memory devices using an error correcting code (ECC) block.

14. The interleaving method of claim 13, wherein detecting the error in the data comprises:
   computing a syndrome, based on whether the data output from at least one of the plurality of memory devices has an error, using a syndrome computation block;
   obtaining coefficients of an error position equation using the syndrome received from the syndrome computation block, using a key equation solver block;
   performing an algorithm for obtaining a solution of the error position equation using the coefficients, using a Chien searching block; and
   obtaining an error position in the data output from the at least one of the plurality of memory devices based on a result of performing the algorithm, using an error evaluator block.

15. The interleaving method of claim 14, wherein the key equation solver block, the Chien searching block, and the error evaluator block operate in a pipeline mode.

16. The interleaving method of claim 13, wherein detecting the error in the data comprises:
   computing a branch metric based on whether the data output from at least one of the plurality of memory devices has an error, using a branch metric calculation block;
   adding a state metric stored in a state metric memory block to the branch metric and outputting a result of the addition as a new state metric, using an add-compare-select block;
   receiving the new state metric from the add-compare-select block and updating state metrics stored in the state metric memory block, using the state metric memory block; and
   obtaining a survivor path for the data output from the at least one of the plurality of memory devices based on the new state metric output from the add-compare-select block, using a survivor path memory block.

17. The interleaving method of claim 16, wherein the add-compare-select block, the state metric memory block and the survivor path memory block operate in a pipeline mode.

18. The interleaving method of claim 10, wherein sending the read command to the one of the plurality of memory devices using the controller comprises:
   outputting one of the chip enable signals to the one of the plurality of memory devices;
   outputting a status check command to the one of the plurality of memory devices;
   outputting data stored in a page buffer of the one of the plurality of memory devices when it is determined that the one of the plurality of memory devices is in a ready state as a status check result; and
   after the output of the data is completed, outputting a read command and an address to the one of the plurality of memory devices to output next data.

19. The interleaving method of claim 10, wherein sending the program command to the one of the plurality of memory devices using the controller comprises:
   outputting one of the chip enable signals to the one of the plurality of memory devices;
   outputting a status check command to the one of the plurality of memory devices;
   outputting a program command and an address to the one of the plurality of memory devices; and
   outputting data associated with the address to a page buffer of the one of the plurality of memory devices, when it is determined that the one of the plurality of memory devices is in a ready state as a status check result.

20. A memory system, comprising:
   a plurality of memory devices;
   a controller configured to control the plurality of memory devices, wherein the controller programs data to one of the plurality of memory devices simultaneous with an internal program operation being performed in another one of the plurality of memory devices; and
   at least one channel connected between the plurality of memory devices and the controller, the at least one channel comprising input/output data lines and control signal lines, which are connected in common with the plurality of memory devices, and chip enable signal lines respectively connected to each of the plurality of memory devices, wherein chip enable signals are provided via the chip enable signal lines to the plurality of memory devices to enable the memory devices independently,
   wherein the one memory device performs the internal program operation when its respective chip enable signal is disabled and the another memory is programmed when its respective chip enable signal is enabled.

* * * * *